United States Patent [19]

Grimes, II et al.

[11] Patent Number: 4,705,949
[45] Date of Patent: Nov. 10, 1987

[54] METHOD AND APPARATUS RELATING TO SPECIMEN CELLS FOR SCANNING ELECTRON MICROSCOPES

[75] Inventors: John W. Grimes, II, Florence, Mont.; Hamlin Jennings; Paul W. Brown, both of Damascus, Md.

[73] Assignee: The United States of America as represented by the Secretary of Commerce, Washington, D.C.

[21] Appl. No.: 802,091

[22] Filed: Nov. 25, 1985

[51] Int. Cl.[4] .............................................. G21K 5/08
[52] U.S. Cl. .............................. 250/440.1; 250/441.1
[58] Field of Search ............... 250/440.1, 441.1, 442.1, 250/443.1, 307

[56] References Cited

U.S. PATENT DOCUMENTS 3,886,358  5/1975  McLaughlin et al. .............. 250/289
4,071,766  1/1978  Kalman et al. .................... 250/443.1

FOREIGN PATENT DOCUMENTS 3017726  11/1981  Fed. Rep. of Germany ... 250/443.1
0042341  4/1981  Japan ................................. 250/440.1

OTHER PUBLICATIONS

Swift et al., An Environmental Cell for the Examination of Wet Biological Specimens at Atmospheric Pressure by Transmission Scanning Electron Microscopy, J Phys E (6B), vol. 3, (Nov. 1970).
Lyon et al, A Differentially Pumped Hydration Chamber for Scanning Transmission Electron Microscopy, Scanning Electron Microscopy (Apr. 1976).

Primary Examiner—Carolyn E. Fields
Assistant Examiner—Paul A. Guss
Attorney, Agent, or Firm—Eugene J. Pawlikowski; Alvin Englert; Stanley C. Spooner

[57] ABSTRACT

Disclosed is an improved specimen cell for maintaining a scanning electron microscope specimen under nearly physiological conditions during observation when said specimen includes liquids having a relatively high vapor pressure. A cavity in the specimen cell mounts an open or closed specimen module which is scanned by the electron beam through a small aperture. During preparation of the electron microscope for observation, the aperture is closed by a door so as to prevent evaporation of liquids from the specimen. The door is mechanically or electronically opened to facilitate observation thus minimizing the exposure of the specimen to the desiccation and/or destructive vacuum effects. Furthermore, the aperture is sized so as to provide a resistance to vapor flow through the aperture while permitting bidirectional electron flow facilitating the electron microscopic observation of the specimen. In a further embodiment, an open specimen module is provided which can be replenished with liquid or fluid, which can be vibrated, raised and/or lowered and which can be heated or cooled as desired during observation of the specimen.

19 Claims, 4 Drawing Figures

METHOD AND APPARATUS RELATING TO SPECIMEN CELLS FOR SCANNING ELECTRON MICROSCOPES

BACKGROUND OF THE INVENTION

1. Field of the Invention

The present invention relates generally to directed beam irradiation devices and specifically to an improved method and apparatus for mounting and maintaining specimens for observation and characterization in a scanning electron microscope.

2. Discussion of the Prior Art

The scanning electron microscope is a powerful instrument which permits observation and characterization on a micrometer or submicrometer scale of heterogeneous organic and inorganic materials. Limited microscopic techniques are available for examining volatile i.e., "wet" samples and biological specimens, where hours of tedious preparation usually is required, resulting in a non-living and disrupted state. Either a relatively low resolution and/or limited depth of focus optical microscope or a specialized high voltage transmission electron microscope equipped with gas reaction cells must be used. The SEM with its great advantage of depth of focus, has only limited capabilities for maintaining a vapor pressure of even a few Torr.

In a SEM, an electron beam is scanned across the specimen to be observed and then electrons reflected or generated from the specimen are detected and the signal generated by the detector is processed to form the enlarged image. In order to properly scan a specimen, an extremely low pressure on the order of $10^{-4}$ TORR is necessary in the specimen chamber of the electron microscope. This extremely low pressure is dramatically less than the vapor pressure of water and a number of other liquids comprising structures of interest. Therefore, in attempting to examine solids, such as hydrated cements or biological samples, inevitably, upon exposure to the high vacuum of the electron microscope, fluid in the solid evaporates rupturing and otherwise destroying the structural arrangement of the subject under investigation. A conventional system in which tissue samples are sectioned while frozen in order to form a thin foil still lose most of their water content immediately upon exposure to the high vacuum rendering them impossible to study. Dry preparation techniques for thin foil specimens are tedious and complicated, often resulting in disruption of and artifact formation in the specimen.

There have been numerous attempts, by freezing or other methods, to slow down the specimen destruction usually meeting with little success. One such method is disclosed in U.S. Pat. No. 4,071,766 to Kalman et al which utilizes a pressure-balancing buffer system to provide a pressure in the vicinity of the specimen which is greater than the vapor pressure of the liquid in the specimen in order to prevent rapid bursting or deterioration. This system utilizes a separate tank containing a liquid or gas which is connected to the specimen mounting chamber and maintains the desired pressure and moist atmosphere to aid in the preservation of the specimen.

The difficulty with such pressure balancing systems is the requirement of an auxiliary pump connected to the electron microscope in order to maintain the high vacuum necessary for the operation of the microscope. Thus, after mounting of the specimen in the microscope, the various pumps are energized and as the microscope nears its operational high vacuum, the balancing system continually evolves a vapor in the chamber in order to attempt to prevent destruction of the specimen. Therefore, the buffer system is generating a vapor and the vacuum pumps are pulling that vapor away in an attempt to reach operational pressure. The buffer system and the vacuum pumps are working at cross purposes and a substantial amount of time is wasted in attempting to reach a stabilized condition in order to begin the electron microscopy. This constant evolution of vapor and then pumping away of the evolved vapor insures that the electron beam must penetrate a substantial thickness of vapor surrounding the specimen in order to accomplish its scanning function. The thickness of vapor penetrated affects the quality of the resultant micrograph and, even though the pressure buffer attempts to maintain the pressure at or about the vapor pressure of the liquid contained in the specimen, deterioration of the specimen is likely.

SUMMARY OF THE INVENTION

It is therefore an object of the present invention to provide a method and an apparatus facilitating the method for controlling and maintaining specimens in their natural environment, minimizing possible disruption and artifact formation resulting from desiccation during exposure to the high vacuum, while being investigated by a directed beam irradiation apparatus, such as, a scanning electron microscope.

It is a further object in accordance with the present invention to provide a method of operating a scanning electron microscope in order to prevent the dehydration and/or disruption of biological tissues before and during operation of a scanning electron microscope.

It is a further object in accordance with the present invention to provide an apparatus to contain and protect biological specimens and volatile or wet samples from dehydration and/or disruption prior to and during operation of a directed beam irradiation apparatus, such as, a scanning electron microscope.

It is a still further object of the present invention to provide an apparatus to minimize the influence of the high vacuum environments of directed beam irradiation apparatus, such as, the specimen chamber of a scanning electron microscope on a volatile specimen, while at the same time maintaining the specimen in a relatively undisturbed state.

Yet another object of the present invention is to provide an apparatus to maximize the ability of a directed beam, i.e. an electron beam to reach the solid surface of the specimen and then allow scattered electrons from that surface to escape from the cell to the appropriate detector.

Another object of the present invention is to provide variant designed embodiments for the apparatus that can be easily loaded into and removed from the apparatus to facilitate specific applications of research investigations, both in the physical and biological sciences.

The above and other objects are achieved in accordance with an apparatus aspect of the present invention by providing an improved specimen cell for use in the evacuated chamber of a directed beam irradiation device, said cell comprising: a closed specimen means for mounting maintaining and at least partially containing said specimen; means for defining an aperture between said specimen and an electron beam when the beam is directed towards the specimen, where the aperture comprises a means for bidirectionally passing electrons and for restricting passage of vapor from within to without said specimen means; and door means having an opened postion and a closed position, for permitting bidirectional electron flow in said open position and blocking said aperture and preventing passage of vapor from within to without said specimen means in said closed position.

The above and other objects are achieved in accordance with a method aspect of applicants' invention in accordance with the steps of: providing a closed specimen means, in the evacuated chamber of a directed beam irradiation device, for mounting maintaining and at least partially containing the specimen where the closed specimen means includes a means for defining an aperture between the specimen and an electron beam when the beam is directed towards the specimen, where the aperture comprises a means for bidirectionally passing electrons and for restricting passage of vapor from within to without said specimen means; providing a door means having an open position and a closed position; locating a specimen in the specimen means and closing and temporarily sealing said door means; reducing the pressure to the normal operating pressure in the evacuated chamber; moving said door means to said open position; scanning said specimen with an electron beam through said aperture; closing said door means after said scanning to prevent further passage of vapor from within to without said specimen means and repeating the sequence of steps from said door opening step should further scanning of the specimen be desired.

BRIEF DESCRIPTION OF THE DRAWINGS

The above and other objects will become more apparent from the following description of the accompanying drawings, wherein.

DETAILED DESCRIPTION OF PREFERRED EMBODIMENTS

Figure 1:
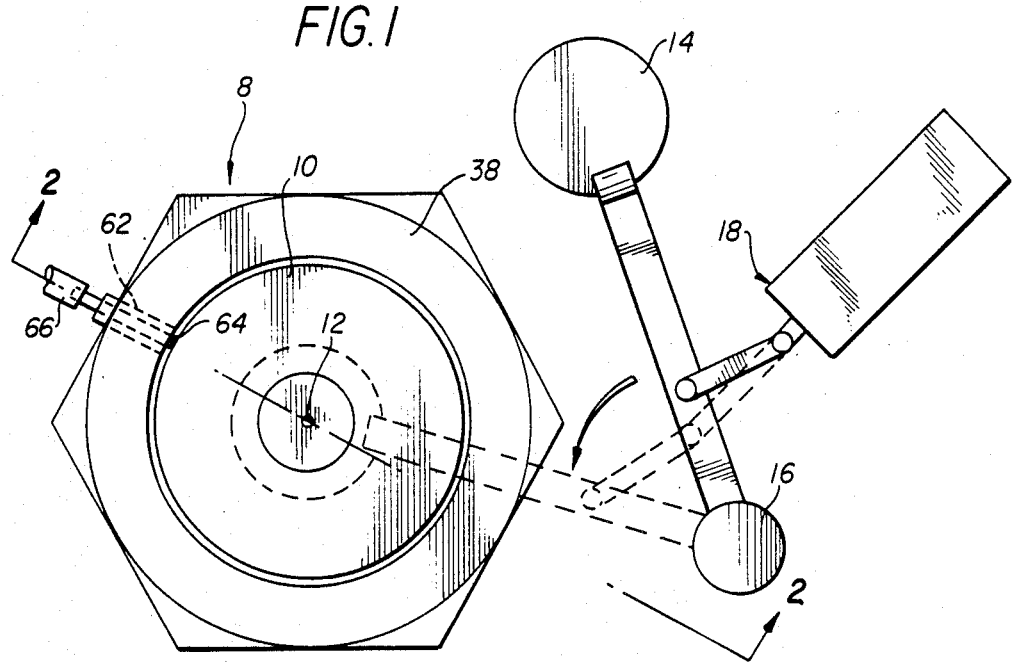
FIG. 1 is a top view of a preferred embodiment of the present invention.

Identical reference numerals refer to similar structures throughout the several views wherein FIG. 1 illustrates the specimen cell 8 in accordance with one embodiment of the present invention. Although the invention is applicable to all directed beam irradiation devices, the following discussion is with reference to the scanning electron microscope (SEM). A closed specimen module 10 is located within the cell 8 and has a small aperture 12 located therein. The aperture comprises a means for bidirectionally passing electrons into and out of the closed specimen module 10 and for restricting passage of vapor out of the inner portion of the specimen module. Such a means in a preferred embodiment comprises an aperture approximately 200 microns in diameter. However, different aperture sizes could be utilized. The aperture must be small enough to slow the escape of vapor to the point where the pressure within the module is maintained higher than the vapor pressure of the volatile constituent of the sample while at the same time allowing the electron beam to reach the solid surface of the specimen in the module and then allow sufficient number of electrons to escape and reach the detector which is external to the specimen module. There appears to be a range of from 200 angstroms to 500 microns which will operate satisfactorily although a different diameter aperature may be desirable depending upon the thickness and geometric configuration of the aperture. In most instances where a biological specimen is being observed, the pressure within the specimen module should be 17.5 mm Hg at 20° C. Of course, it is desirable that the specimen module be maintained vacuum tight so as to prevent vapor loss except through the aperture 12 when opened for observation.

In order to prevent any significant escape of vapor from the aperture of the specimen module 10 while the microscope is being pumped down to its operating pressure, door 14 is slid over and lowered into place sealing aperture 12. The door can pivot about fixed support 16 under the influence of an opening and closing means 18 schematically indicated in FIG. 1. This could comprise any means for moving the door 14 between the illustrated open position and its closed position shown in phantom line. Such a means could be a motor/gear train combination, a solenoid and linkage arrangement, or other pneumatic/hydraulic/electro-mechanical devices. It is only important that the door be controllably movable between its two positions.

Figure 2:
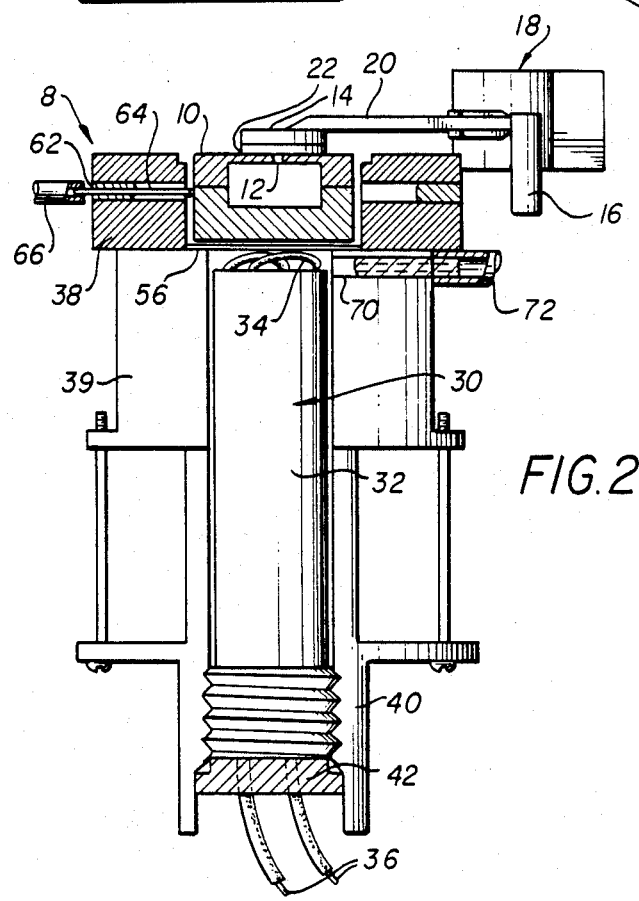
FIG. 2 is a cross-sectional view of the subject matter of FIG. 1 along section lines 2—2.

Additional details of the improved specimen cell 8 can be seen in FIG. 2 which is a section of the apparatus in FIG. 1 taken along section lines 2—2. It can be seen that in a preferred embodiment, the closed specimen module 10 comprises an upper and a lower portion (containing a sealed port 11 for initial induction of specimen) which are mated together by any convenient means such as threaded fasteners. The aperture 12 can be blocked and/or sealed during non-observational periods by a door which is pivotally connected to fixed support 16 by arm 20. In a preferred embodiment, the upper portion of door may be comprised of a metal plate 14 welded to arm 20 with a lower portion comprising an elastomeric sealing material 22.

Should it be desirable to heat or maintain the temperature of specimen module 10, a heater element 30 could be inserted into the lower portion 40 of the cell. As shown in FIG. 2, such a heater is comprised of a porcelain insulator 32 (998 alumina) with nichrome resistance wires 34 (28 gauge, 4.1 ohms per foot) connected by means of outlet wires 36 to a suitable power supply. The porcelain insulator is threadably received into the lower portion 40 of the specimen cell and is sealed therewith by means of high temperature glass 42. In order to maintain the temperature of a specimen below ambient temperature, e.g., a frozen specimen, conventional cooling means (not shown) can be used.

Figure 3:
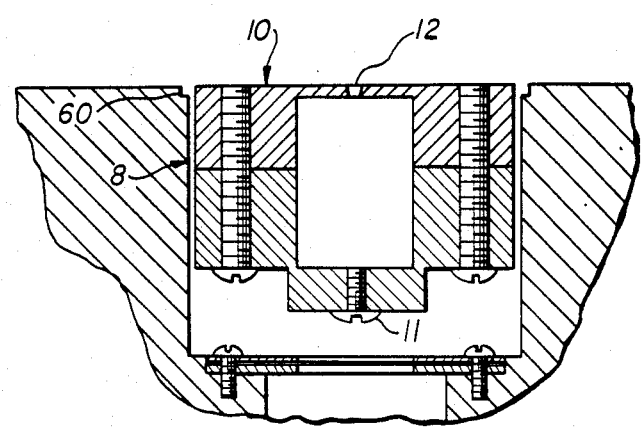
FIG. 3 is a partial section view of one embodiment of the present invention.

The details of a preferred embodiment of a closed specimen module can be seen in FIG. 3 where the upper and lower halves are joined by a plurality of machine screws around the periphery of the chamber. In order to obtain the best scanning resolution, it is desirable that the chamber volume be relatively large but the distance from the aperture 12 to the specimen be minimized. This is to reduce, to the extent possible, the vapor thickness through which the electron beam must penetrate before reaching the specimen surface. The closed specimen module 10 can merely be placed in the upper portion 8 of the specimen cell, without any further anchoring means located therein, and, as long as its upper surface is relatively smooth and aperture 12 can be sealingly closed by door 14 in the closed position, the apparatus will work properly.

Figure 4:
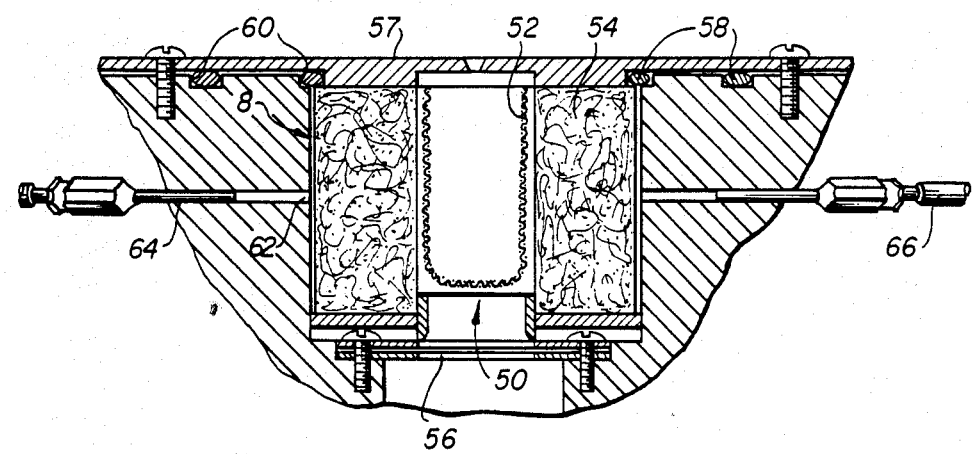
FIG. 4 is a partial section view of a further embodiment of the present invention.

However, it is often desirable to be able to add liquid or vapor to the specimen either immediately prior to or during an observation (as in the studies of hydrating cement) and thus an open specimen module 50 is illustrated in FIG. 4. The reference to an open specimen module system is because there are other openings besides the aperture, leading to the specimen chamber of the module, which serve as attachments for various peripheral embodiments. However, the specimen system is closed to the vacuum chamber of the SEM except for aperture 12. Such a module could comprise a mesh specimen cage 52 surrounded by a liquid/gas induction shroud (to prevent injected liquid/gas from directly impinging upon and disturbing the observed specimen) and the mounting structure for maintaining the cage position. In this instance, the shroud 54 partially supports the cage 52 and is in turn supported by a frame surrounding the metallic, plastic or elastic diaphragm 56 which is located between upper portion 38 and central portion 39 of the specimen cell and is affixed to the perimeter of the floor of the cell cavity for receiving the specimen modules.

The upper portion of the open specimen module comprises a chamber lid 57 shaped so as to sealingly compress seals 58 in grooves 60 around the periphery of the cavity. The chamber lid is affixed securely by any convenient means such as welding or thread fasteners to the upper surface of the open specimen module system and is also affixed to the upper surface of the controlled environmental chamber of the specimen cell by non-permanent means, such as thread fasteners, in such a manner so as not to disturb the planar profile of the lid surface, thus hindering proper sealing of the door over the aperture. Therefore, any specimen located within cage 52 can have a pressure greater than the high vacuum external to the chamber lid 57. As noted, it may be desirable to maintain the open specimen module at a certain gas pressure or add liquid to the vicinity of the specimen before or during observation. Accordingly, an injection port 62 is provided through the side of the upper portion of the specimen cell and threadably received therein is an injector 64 which is in fluid communication with tubing 66. A plurality of injectors could be located around the periphery of the open specimen module to provide either liquid or gas immediately adjacent the specimen during observation.

It may also be desirable to have the capability of agitating or raising and lowering the specimen during observation and to this end, an induction port 70 is provided in an intermediate portion of the specimen cell allowing communication between induction tube 72 and the lower side of elastic diaphragm 56. If a rubber diaphragm is used, it can be inflated and raised to a desired position thus raising the specimen to a level just below the aperture. By modulating the pressure of air or other gas on the bottom side of diaphragm 56, the diaphragm can oscillate the specimen located within cage 52.

A typical scanning electron microscopic examination might initially require 15 to 20 minutes in which to pump down the microscope's vacuum chamber into which specimen cell 8 has been inserted. During this entire time, of course, the door 14 would be in place blocking vapor passage through the bidirectional electron and vapor retaining window comprised of aperture 12. Only when the microscope has reached its operating pressure, and is ready to begin observation of the specimen, is door 14 removed and it is only at this point that, due to the higher vapor pressure in the specimen module does vapor begin to flow through aperture 12. Because the electron beam can be focused relatively quickly based upon preliminary settings, scanning of the specimen and detection of the reflected electrons is usually achieved in the space of two or three minutes, there has been a significant, i.e. on the order of a ten-fold decrease in the time of exposure of the specimen to a reduced pressure or vapor loss.

Furthermore, the utilization of vapor replenishment through the injection port (for an open specimen module) can maintain the vapor pressure relatively easy for this short observation time without the additional strain on the microscope's vacuum pumping ability which would be present in a constant or continuous supply system such as disclosed in Kalman et al. It will be remembered that the Kalman et al pressure-balancing buffer system would be supplying a pressure greater than the vapor pressure of the specimen to the specimen chamber from the beginning of vacuum chamber pumpdown through the completion of the observation period. Induction port 70 can also be used if it is desirable to cool the specimen in either an open or closed specimen module by introducing small amounts of a liquid refrigerant, nitrogen, etc. into the region of the diaphragm.

In view of the above disclosure, many modifications and variations of the present invention will be obvious to those of ordinary skill in the art. For example, a pivoting rather than sliding door could be utilized with any number of variations on the door opening mechanism. Different materials could be used for the door with the only critical requirement being that performance of the door is optimized if the sealing relationship of the aperture 12 by the door is maximized when in the closed position. Utilization of the cell with most existing scanning electron microscopes is enhanced by utilizing a sliding door such that the door is away from the path of any electrons travelling from aperture 12 to the detector of the microscope.

Although two preferred embodiments of the specimen modules have been disclosed (one closed and one open), different embodiments could be utilized depending upon the particular specimen desired and the specific process to be observed. For example, the diaphragm 56 could be utilized to raise one constituent into physical contact with another constituent in order to observe catalytic reaction, polymerization, etc. The arrangement of injection ports, induction ports, heaters, etc. can be modified depending upon the needs of a particular specimen and scanning electron microscope.

Therefore, although the present specification is by way of example and description of preferred embodiments of the present invention, it is by no means limiting thereof of applicants' invention. The invention is limited only by the following claims appended hereto.

What is claimed is:

1. An improved specimen cell for use in the evacuated chamber of a directed beam irradiation device having an electron beam, said cell comprising:
   means for preventing dehydration and disruption of a specimen placed in the cell including closed specimen means for mounting and at least partially containing said specimen;
   means for defining a single aperture between said specimen and said electron beam when said beam is directed towards said speciman, said aperture comprising a means, sized and gometrically configured, for bidirectionally passing electrons and for restricting passage of vapor from within to without said specimen means; and door means mounted on a pivotable arm for movement between an opened position and a closed position, for permitting bidirectional electron flow in said open position and for blocking said single aperture and for preventing passage of vapor from within to without said specimen means in said closed position, said door means comprising a backing metal plate attached to said arm and a facing of elastomeric material for blocking said aperture.

2. The specimen cell according to claim 1, wherein said specimen means comprises a closed specimen module.

3. The specimen cell according to claim 1, wherein said specimen means comprises a specimen cell body and an open specimen module.

4. The specimen cell according to claim 2, wherein said closed specimen module comprises an upper portion and a lower portion and said means for defining a single aperture comprises a single aperture in said upper portion.

5. The specimen cell according to claim 3, wherein said open specimen module includes an upper chamber lid and a mesh specimen mounting means located thereunder.

6. The specimen cell according to claim 5, wherein said open specimen module further includes a liquid/gas induction shroud surrounding said mesh means.

7. The specimen cell according to claim 6, wherein said open specimen module further includes sealing means for sealing said chamber lid to said specimen cell body.

8. The specimen cell according to claim 1, wherein said aperture has a diameter within the range of from 200 angstroms to 500 microns.

9. The specimen cell according to claim 8, wherein said aperture diameter is substantially equal to 200 microns.

10. The specimen cell according to claim 3, wherein said cell body includes a means for heating said open specimen module.

11. The specimen cell according to claim 3, wherein said cell body includes a means for cooling said open specimen module.

12. The specimen cell according to claim 3, wherein said cell body includes a means for injecting a fluid into said open specimen module.

13. The specimen cell according to claim 3, wherein said specimen cell body includes upper, middle, and lower portions with said upper and middle portions separated by a diaphragm and further including means for introducing a fluid into said middle portion forcing said diaphragm to move towards said upper portion.

14. The specimen cell according to claim 13, wherein said means for introducing a fluid includes a means for modulating said fluid for causing said diaphragm to vibrate.

15. The specimen cell according to claim 2, wherein said cell body includes a means for heating said closed specimen module.

16. The specimen cell according to claim 2, wherein said cell body includes a means for cooling said closed specimen module.

17. A method of exposing a specimen to the electron beam of a directed beam irradiation device in a vacuum chamber without destroying high vapor pressure specimens, said method comprising:

providing a closed specimen means, in said vacuum chamber, for mounting and at least partially containing said specimen where said closed specimen means includes means for defining an aperture between said specimen and said electron beam when said beam is directed towards said specimen, wherein said aperture comprises means for bidirectionally passing electrons and for restricting passage of vapor from within to without said specimen means;

providing a door means having an open position and a closed position;

locating a specimen in the specimen means and closing said door means;

reducing the pressure in the evaucated chamber to the normal electron microscope operating pressure while maintaining the door means in said closed position;

moving said door means to said open position; and scanning said specimen with said electron beam through said aperture.

18. The method according to claim 17, further including after said scanning step the additional steps of:

closing said door means after said scanning to prevent further passage of vapor from within to without said specimen means; and repeating said opening, scanning, and closing steps for further scanning of said specimen.

19. An improved specimen cell for use in the evacuated chamger of a directed beam irradiation device having an electron beam, said cell comprising:

a sole means for preventing dehydration and disruption of a specimen placed in the cell including closed specimen means for mounting and at least partially containing said specimen;

means for defining a single aperture between said specimen and said electron beam when said beam is directed towards said specimen, said sperture comprising a means, sized an geometrically configured, for bidirectionally passing electrons and for restricting passage of vapor from within to without said specimen means; and door means, mounted in a pivotable arm for movement between an opened position and a closed position for permitting bidirectional electron flow in said open position and for blocking said single aperture and for preventing passage of vapor from within to without said specimen means in said closed position said door means comprising a backing metal plate attached to said arm and a facing of elastomeric material for blocking said aperture.

* * * * *